United States Patent
Lepage et al.

(10) Patent No.: US 9,821,736 B2
(45) Date of Patent: Nov. 21, 2017

(54) DEVICE FOR VENTILATING AND SUPPLYING ELECTRICAL POWER TO AN AIRCRAFT ENGINE COMPUTER

(71) Applicant: SNECMA, Paris (FR)

(72) Inventors: Thomas Lepage, Vincennes (FR); Bruno Robert Gaully, Marolles en Hurepoix (FR)

(73) Assignee: SNECMA, Paris (FR)

( * ) Notice: Subject to any disclaimer, the term of this patent is extended or adjusted under 35 U.S.C. 154(b) by 493 days.

(21) Appl. No.: 14/412,269

(22) PCT Filed: Jun. 28, 2013

(86) PCT No.: PCT/FR2013/051529
§ 371 (c)(1),
(2) Date: Dec. 31, 2014

(87) PCT Pub. No.: WO2014/006309
PCT Pub. Date: Jan. 9, 2014

(65) Prior Publication Data
US 2015/0183387 A1    Jul. 2, 2015

(30) Foreign Application Priority Data
Jul. 2, 2012  (FR) ...................................... 12 56337

(51) Int. Cl.
*B60L 3/00* (2006.01)
*B60L 1/00* (2006.01)
(Continued)

(52) U.S. Cl.
CPC .......... *B60R 16/0307* (2013.01); *B60R 16/03* (2013.01); *B64D 47/00* (2013.01);
(Continued)

(58) Field of Classification Search
CPC ..... B60R 16/03; B60R 16/0307; B64D 47/00; G06F 1/20; G06F 1/26; H02K 7/1823; H05K 7/20136; H05K 7/20172
(Continued)

(56) References Cited

U.S. PATENT DOCUMENTS 4,351,150 A * 9/1982 Schulze ................ F01D 17/085
60/226.1
4,504,030 A * 3/1985 Kniat ................. H05K 7/20136
244/117 A
(Continued)

FOREIGN PATENT DOCUMENTS

EP    0 111 437 A1    6/1984
EP    0 213 019 B1    9/1989
(Continued)

OTHER PUBLICATIONS

International Search Report dated Sep. 17, 2013 in PCT/FR2013/051529 Filed Jun. 28, 2013.

*Primary Examiner* — Rexford Barnie
*Assistant Examiner* — Toan Vu
(74) *Attorney, Agent, or Firm* — Oblon, McClelland, Maier & Neustadt, L.L.P.

(57) ABSTRACT

A device for ventilating and electrically powering a computer of an engine of an aircraft, the device including a feed mechanism feeding air to a proximity of the computer and a fan connected to a drive mechanism and configured to generate a stream of air for ventilating the computer. The fan is mounted in the air feed mechanism, and the drive mechanism includes an electrical machine configured to operate as a motor for driving the fan, and as a generator for powering the computer, a rotor of the machine when operating as a generator being driven by the fan, which is itself driven by a stream of air flowing in or leaving the air feed mechanism.

10 Claims, 3 Drawing Sheets

(51) Int. Cl.
*H02G 3/00* (2006.01)
*B60R 16/03* (2006.01)
*H05K 7/20* (2006.01)
*B64D 47/00* (2006.01)
*G06F 1/20* (2006.01)
*G06F 1/26* (2006.01)
*H02K 7/18* (2006.01)

(52) U.S. Cl.
CPC ............... *G06F 1/20* (2013.01); *G06F 1/26* (2013.01); *H02K 7/1823* (2013.01); *H05K 7/20136* (2013.01); *H05K 7/20172* (2013.01)

(58) Field of Classification Search
USPC .......................................................... 307/9.1
See application file for complete search history.

(56) References Cited

U.S. PATENT DOCUMENTS

| | | | |
|---|---|---|---|
| 4,601,202 A | | 7/1986 | Colman et al. |
| 4,608,819 A | * | 9/1986 | Colman ............... F01D 17/02 361/690 |
| 4,674,704 A | * | 6/1987 | Altoz ............... H05K 7/20136 244/1 R |
| 4,716,722 A | | 1/1988 | Rambach |
| 7,364,117 B2 | | 4/2008 | Dionne |
| 2005/0279103 A1 | | 12/2005 | Bowers et al. |
| 2006/0196633 A1 | | 9/2006 | Mahjoub |
| 2011/0011683 A1 | | 1/2011 | Tetsuka et al. |
| 2011/0271655 A1 | | 11/2011 | Poisson |
| 2012/0151933 A1 | | 6/2012 | Ouplomb |

FOREIGN PATENT DOCUMENTS

| | | |
|---|---|---|
| EP | 1 610 606 A1 | 12/2005 |
| JP | 59-105936 A | 6/1984 |
| JP | 2007-514581 A | 6/2007 |
| JP | 2011-523610 A | 8/2011 |
| RU | 2 384 488 C2 | 9/2008 |
| WO | WO 2009/143954 A1 | 12/2009 |

* cited by examiner

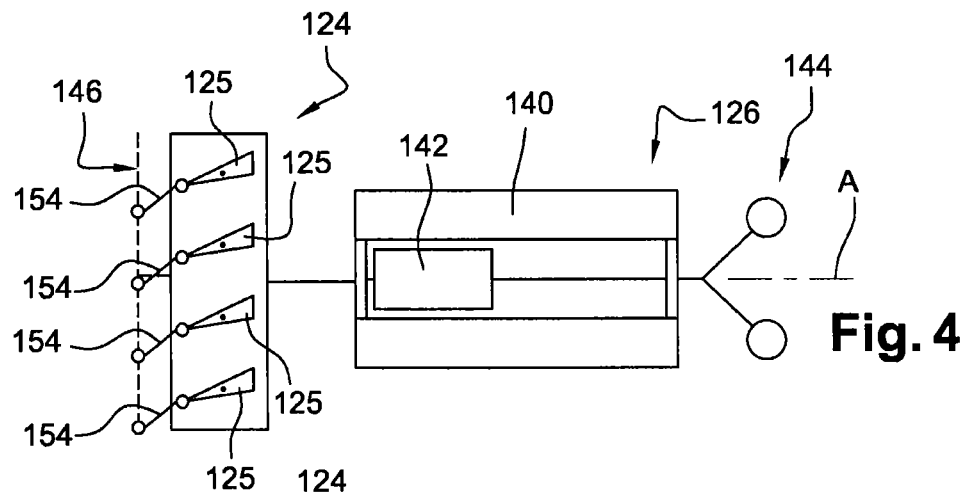
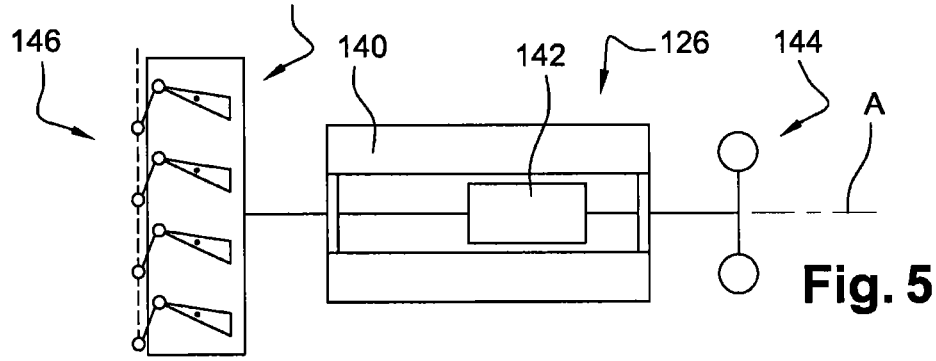
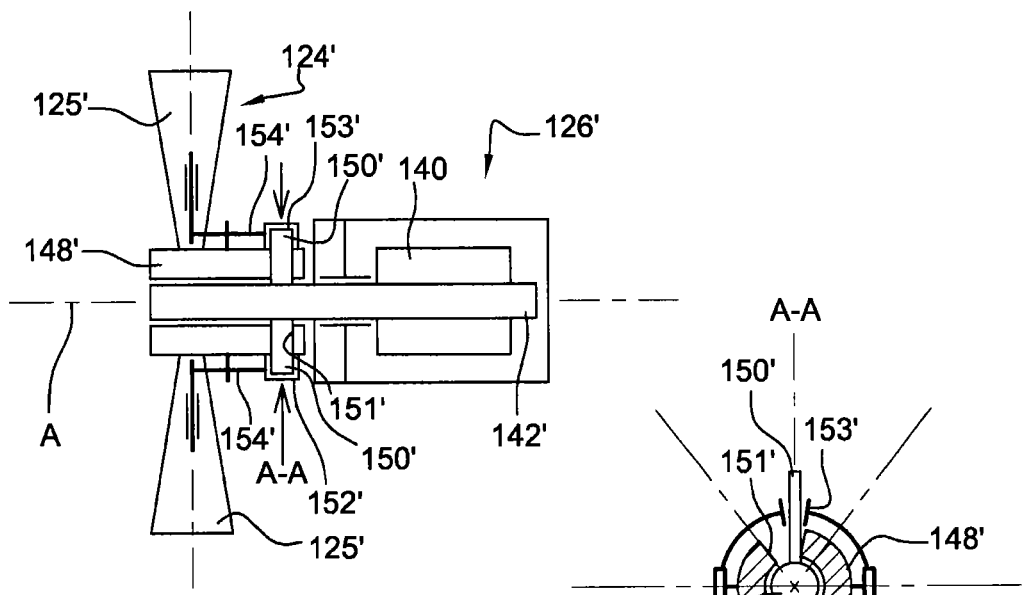

DEVICE FOR VENTILATING AND SUPPLYING ELECTRICAL POWER TO AN AIRCRAFT ENGINE COMPUTER

The present invention relates to a device for ventilating and electrically powering a computer of an aircraft engine, in particular an airplane turboprop or turbojet.

A computer of this type, commonly referred to in the field of aviation as an electronic control unit (ECU), has the function of regulating the power and the speed of rotation of the engine as a function of various parameters.

The computer is connected by connection/disconnection means to electrical power supply means of the aircraft and to a permanent magnet alternator (PMA) that is mounted in the accessory gearbox (AGB) of the engine. While the aircraft is on the ground, the computer is powered electrically by the electrical power supply means of the aircraft, and while the aircraft is in flight, the computer is powered by the PMA. Nevertheless, the PMA constitutes equipment that is bulky and that occupies a relatively large amount of space in the AGB.

The computer is cooled by ventilation air that is brought to the vicinity of the computer or into an enclosure containing the computer. In the prior art, the engine includes a scoop for collecting a portion of the air stream flowing outside the engine, with this air that is collected being guided by a duct to the computer. Nevertheless, the flow rate at which air is taken depends in particular on the dimensions of the scoop, and over dimensioning the scoop leads to a corresponding increase in drag and thus to an increase in the specific fuel consumption of the engine. Furthermore, those ventilation means are effective only while the aircraft is in flight. When the aircraft is stationary on the ground, no air flow is collected by the scoop and the computer is not cooled, even though it needs to remain operational during certain stages of maintenance and also while the engine is stopped but is continuing to give off heat by radiation, by the so-called "soak-back" phenomenon).

Proposals have already been made to cool a computer by means of a ventilator having a fan, in particular when the aircraft is stationary on the ground. The rotor of the ventilator is driven by a motor that is powered and controlled by the computer. Nevertheless, when the aircraft is in flight, the computer is still powered by the PMA, which is bulky.

A particular object of the present invention is to provide a solution to the problems of the prior art that is simple, effective, and inexpensive.

To this end, the invention provides a device for ventilating and electrically powering a computer of an engine of an aircraft, the device comprising means for feeding air to the proximity of the computer and a fan connected to drive means and suitable for generating an air stream for ventilating the computer, the device being characterized in that the fan is mounted in the air feed means or at the outlet from said means, and in that the drive means comprise an electrical machine suitable for operating as a motor to drive the fan when the aircraft is on the ground so as to generate the stream of air for ventilating the computer, and as a generator to power the computer electrically while the aircraft is in flight, the rotor of the electrical machine operating as a generator being driven by the fan, which is itself driven by a stream of air taken from outside the engine when the aircraft is in flight, and flowing along or leaving the air feed means.

In the device of the invention, the fan is configured to operate as a turbine while the aircraft is in flight and as a compressor while the aircraft is on the ground. When the fan operates as a turbine, it is driven by the stream of air flowing in the means for feeding air to the computer, and in turn it drives the rotor of the electrical machine, which then operates as an electricity generator in order to power the computer. While the fan is operating as a compressor, it generates a stream of ventilation air for the computer and it is itself driven by the rotor of the electrical machine operating as a motor, and which may be under the control of the computer and connected of the electrical power supply means of the aircraft.

The device of the invention thus makes it possible to ventilate the computer and to power it electrically without using a PMA. The prior art PMA is thus not necessarily mounted in the AGB, thereby releasing significant space in the AGB for installing other equipment. The drive for the PMA via the AGB could be replaced by pneumatic drive. The PMA could be provided with a motor function in order to provide the function of ventilating the computer. Such a two-function PMA would then make it possible to avoid having a dedicated fan motor. Furthermore, when operating as an alternator, with drive being provided by the air, that enables a line to be eliminated from the gearbox of the engine, and thus leads to a saving in weight and in bulk.

The invention thus makes it possible to provide a solution to the two above-mentioned problems of cooling the computer on the ground and of the space occupied by the PMA for electrically powering the computer in flight.

The electrical machine may be a brushless permanent magnet motor, e.g. powered by a three-phase stator. When the machine is connected to electrical power supply means of the aircraft in order to be powered on the ground, the power supply means may likewise be of the three-phase type. The electrical machine operating in wind turbine mode or in ventilator compressor mode consumes an amount of electrical power that is close to the amount that needs to be generated for powering the computer, which is of the order of 100 watts (W) to 300 W, e.g. lying in the range 150 W to 200 W.

The electrical machine advantageously has two stators that are electrically connected to the computer via independent paths. This redundancy serves to improve the reliability of the device, in particular when the generator function is active. When the electrical machine is operating as a generator, each stator feeds power to a path that is connected to the computer. In the event of one of these paths failing, the other path continues to provide the computer with electrical power. While the electrical machine is operating as a motor, it is possible to use only one path for powering the electrical machine.

The fan has radial blades that may be of fixed or of variable angular pitch about their respective radial axes.

When the fan blades are of fixed pitch, they may have an orientation that is determined so as to optimize one of the two above-mentioned functions (compressor or turbine) or that represents a compromise between those two functions.

When the blades of the fan are of the variable-pitch type, the electrical machine may include a rotor that is movable in translation inside the stator, with one end connected to means for actuating and pivoting the blades about their axes, and with its other end connected to a fly-weight governor or centrifugal governor.

The operation of a fly-weight governor is well known to a person skilled in the art. The fly-weight governor is configured to move the rotor in translation inside the stator of the electrical machine as a function of its speed of rotation. When the speed of rotation of the fly-weight governor is relatively low, the governor is in a first position in which its fly-weights are close together and the rotor is situated at one axial end of the stator. When the speed of rotation of the fly-weight governor is relatively high, the governor is in a second position in which its fly-weights are spaced apart from each other and the rotor is situated at the opposite axial end of the stator. The speeds are a function in particular of the dimensions of the electrical machine. It is the increase in the speed of rotation of the governor and thus of the fly-weights that causes the fly-weights to move radially outwards (as a result of centrifugal forces), and causes the rotor to move axially in translation.

In a variant, the electrical machine may comprise a rotor having one end surrounded by a hub supporting blades and around which a ring is mounted to move in turning and is connected by links to means for pivoting the blades about their respective radial axes, the hub being movable in turning around the rotor, which includes at least one radial finger passing through a circumferential slot in the hub and an orifice of the ring, the angular movement of the ring around the hub being a function of the angular movement of the radial finger of the rotor in the slot of the hub.

The ring may be centered and guided in rotation around the hub. The rotor may have two diametrically opposite radial fingers, each passing through a respective circumferential slot in the hub and a respective orifice in the ring. The radial fingers of the rotor are engaged substantially without slack in the orifices in the ring. The slots in the hub have circumferential dimensions that are determined as a function of the above-mentioned angular movements, which are of the order of 20° to 60°.

The movement of the radial fingers in the slots in the hub causes the blades to pivot about their axes. In a first position in which each radial finger is situated at one circumferential end of the corresponding slot, the fan blades may have an orientation that is optimized for operation of the fan as a compressor, and in an opposite, second position in which each radial finger is situated at the opposite end of the slot, the fan blades may have an orientation that is optimized for operation of the fan as a turbine. The rotor of the motor/generator needs to be driven in rotation in a first direction, e.g. clockwise, for the radial fingers to be in the above-mentioned first position so as to drive in rotation the hub, the ring, and the blades in order to operate as a compressor, and it needs to be driven in rotation in the opposite direction (counterclockwise) so that the radial fingers are in the above-mentioned second position and drive in rotation the hub, the ring, and the blades in order to operate as a turbine.

The present invention also provides a method of using the device as described above, characterized in that, when the aircraft is in flight, air flowing in the feed means passes through and drives rotation of the fan, which in turn drives rotation of the rotor of the electrical machine in order to power the computer, which is cooled by the air leaving the feed means, and while the aircraft is on the ground, electrical power supply means of the aircraft power the computer and the electrical machine in order to drive the fan so as to generate a stream of ventilation air for the computer.

The invention can be better understood and other characteristics, details, and advantages thereof appear more clearly on reading the following description made by way of non-limiting example and with reference to the accompanying drawings, in which:

FIGS. 4 and 5 are diagrammatic axial section views of an electrical machine for a device of the invention, showing respectively two different axial positions of the rotor in the stator of the machine;

FIG. 6 is a diagrammatic axial section view of a variant embodiment of the electrical machine for a device of the invention; and FIG. 7 is a section view on line AA of FIG. 6.

Figure 1:
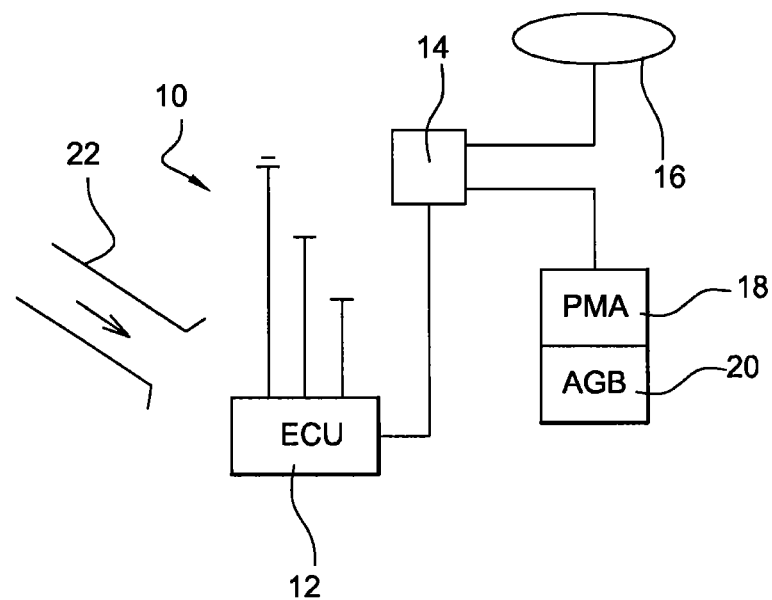
FIG. 1 is a very diagrammatic view of a prior art device for ventilating and electrically powering a computer of an aircraft engine.

Reference is made initially to FIG. 1, which shows a prior art device 10 for ventilating and electrically powering a computer 12 (and more specifically an ECU) of an aircraft engine, and in particular of an airplane turbine engine, such as a turboprop or a turbojet.

The computer 12 is electrically connected by connection/disconnection means 14 to means 16 for electrically powering the aircraft and to a PMA 18 that is mounted in the AGB 20 of the engine and that has its rotor driven by the AGB.

The turbine engine also has a scoop (not shown) for extracting a portion of the air stream flowing around the engine while the aircraft is in flight, this scoop being connected to feed means 22 for delivering air to the computer 12 in order to cool it.

In flight, the computer 12 is powered by the PMA 18 and it is cooled by the stream of air delivered by the feed means 22. On the ground, the computer 12 is powered by the power supply means 16 of the aircraft and it is not cooled, which raises problems.

Figure 2:
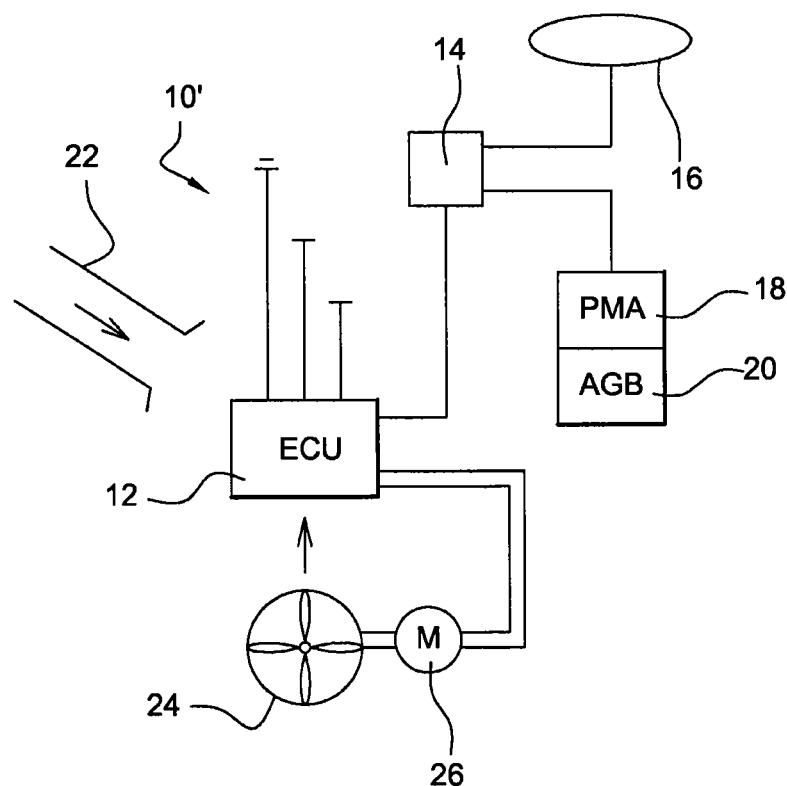
FIG. 2 is a diagrammatic view of another prior art device for ventilating and electrically powering a computer of an aircraft engine.

FIG. 2 shows another prior art device 10' for ventilating and electrically powering a computer 12 of an aircraft engine, this device differing from the device of FIG. 1 in that it further includes a ventilator 24 for generating a stream of air for ventilating the computer 12 while the aircraft is on the ground.

The fan of the ventilator 24 is driven in rotation by a motor 26 that is controlled by the computer 12.

In flight, the computer 12 is powered by the PMA 18 and it is cooled by the stream of air delivered by the feed means 22. On the ground, the computer 12 is powered by the power supply means 16 of the aircraft and it is cooled by the stream of air delivered by the ventilator 24.

Nevertheless, the problem of the size of the PMA is not solved since the PMA is still needed in the prior art to power the computer 12 electrically while in flight. Furthermore, the motor 26 is dedicated to driving the ventilator 24.

Figure 3:
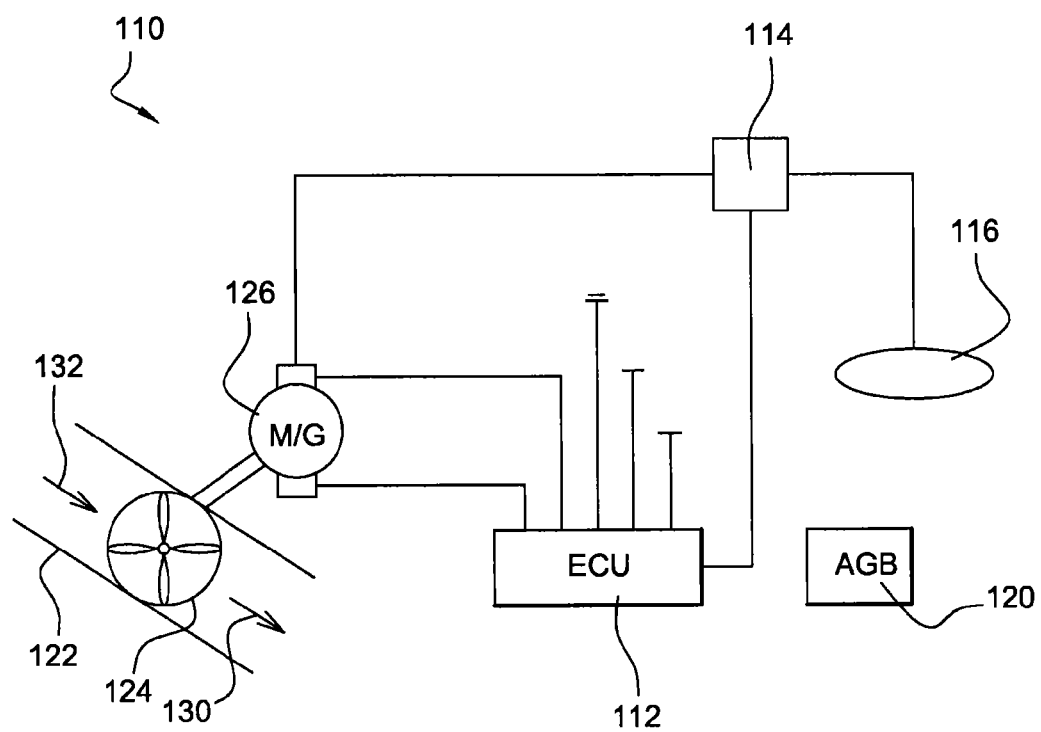
FIG. 3 is a diagrammatic view of a device for ventilating and electrically powering a computer of an aircraft engine.

The invention makes it possible to remedy this problem by the device 110 shown in FIG. 3 that comprises a computer 112 (ECU), a ventilator fan 124 mounted in the air feed means 122 and configured to operate as a turbine or as a compressor, and an electrical machine 126 (M/G) that is suitable for powering the computer 112 electrically while the fan is operating as a turbine and for driving the fan in rotation when it is operating as a compressor.

The computer 112 and the electrical machine 126 are connected by connection/disconnection means 114 to the electrical power supply means 116 of the aircraft. The AGB 120 does not have a PMA, and its drive is the mechanical drive of the PMA (no dedicated line).

While the aircraft is on the ground, the means 116 power the electrical machine 126 (operating as a motor) and the computer 112 is cooled by the stream of air 130 delivered by the fan 124 (operating as a compressor). The fan 124 is secured to the rotor of the electrical machine 126 and the rotation of the machine is controlled and regulated by the computer 112.

The electrical machine 126 is preferably a brushless permanent magnet motor with its stator powered by a three-phase network of the aircraft. The power delivered to this machine may for example be of the order of 150 W.

The electrical machine 126 advantageously has two independent stators that are electrically connected to the computer 112 by independent paths. It is possible to use a single one of these paths for electrically powering the machine 126.

While the aircraft is in flight, the computer 112 is powered by the electrical machine 126 (operating as a generator) and it is cooled by the stream of air 132 leaving the air feed means 122, which are connected upstream to air collector means, e.g. of the scoop type. The air stream 132 passes through the fan 124 and drives it in rotation about its axis prior to serving to ventilate the computer 112. The fan 124 then acts as a turbine that is driven by the stream of air 132 and that in turn drives the rotor of the electrical machine 126 in order to generate electricity for powering the computer 112.

When the electrical machine 126 has two independent stators that are electrically connected to the computer 112 by independent paths, both paths are used for powering the computer and for mitigating the risk of one of the paths failing. The power delivered by the electrical machine 126 to the computer may for example of the order of 200 W.

As described above, the fan 124 performs both a turbine function and a compressor function depending on whether it is driven by the air flowing in the means 122 or by the electrical machine 126.

For this purpose, the fan 124 may have fixed-pitch blades, i.e. the angular pitch of each blade about its own radial axis is constant. This pitch may be designed to optimize one of the two above-mentioned functions (compressor or turbine), or it may represent a compromise between those two functions. Rotating the fan in one direction (e.g. clockwise) about its axis enables it to operate as a compressor and generate a stream of air, while delivering a stream of air upstream from the fan enables it to be rotated and to operate like a turbine driving the rotor of the electrical machine.

In a variant, the fan has variable pitch blades. FIGS. 4 and 5 show a first embodiment and FIGS. 6 and 7 show a different second embodiment of this fan and of the associated electrical machine.

In the embodiment of FIGS. 4 and 5, the electrical machine 126 comprises a stator 140 and a rotor 142 that is movable in axial translation inside the stator and that presents an axial dimension that is shorter than that of the stator.

The rotor 142 has one axial end connected to a fly-weight governor 144, and its opposite axial end connected to actuator means for causing the blades 125 of the fan 124 to pivot.

The fly-weight governor 144 has at least two fly-weights arranged around a circumference centered on the longitudinal axis A of the rotor of the motor/generator 126, with each of them being connected to one end of a rod having its opposite end hinged about an axis perpendicular to the axis A at the above-mentioned end of the rotor. When the rotor 142 of the electrical machine 126 rotates, the fly-weights are urged outwards by centrifugal forces and they are movable from a first position shown in FIG. 4 where they are close to each other and to the axis A, and a second position shown in FIG. 5 where they are spaced apart from each other and from the axis A.

In the example shown, the means 146 for actuating the blades 125 comprise a ring of axis A connected to the end of the rotor 142 remote from the fly-weight governor 144, and connected by links 154 to the blades 125, each of which can be pivoted about a radial axis.

The movement of the fly-weight from the first position to the second position causes the rotor 142 to move from one end of the stator 140 to the opposite end of the stator, and causes the blades to pivot about their radial axes, as can be seen in FIGS. 4 and 5.

In the variant embodiment of FIGS. 6 and 7, the electrical machine 126' comprises a stator 140' and a rotor 142' having one end extending beyond the stator and surrounded by a hub 148' carrying the blades 125' of the fan 124' and free to turn on said end of the rotor over a predetermined angular range.

The rotor 142' is secured to two radial fingers 150' that are diametrically opposite and that are engaged in radial slots 151' passing through the hub. These slots 151' are circumferentially oriented, and each finger 150' is movable circumferentially in one of these slots, between a first position (shown in FIG. 7) where it bears against one of the circumferential ends of the slots and a second position in which it bears against the opposite circumferential ends of the slots. The angular travel of the fingers in the slots is a function of the circumferential size of the slots, and may for example be of the order of 30° to 60°.

The hub 148' is surrounded by a ring 152' that is centered and guided in rotation on the hub around the longitudinal axis A of the electrical machine 126'. The ring 152' has radial orifices 153' through which the free ends of these free ends of the fingers 150' pass in order to pivot the ring about the axis A over the above-mentioned angular range. The ring 152' is connected by a links 154' (e.g. of L-shape) to means for driving the blades about their axes.

The movement of the radial fingers 150' in the slots 151' of the hub 148' cause the ring 152' to turn relative to the hub 148' and cause the blades 125' to turn about their axes. By way of example, when the rotor 142' of the electrical machine 126' is moved clockwise, the radial fingers 150' come into the above-mentioned second position and the blades of the fan 124' are oriented so that the operation of the fan as a compressor is optimized. Clockwise rotation of the fan then serves to generate a stream of ventilation air. When the rotor 142' is moved counterclockwise, the radial fingers 150' move into the above-mentioned first position and the blades of the fan 124' are oriented so that the operation of the fan as a turbine is optimized. The stream of air passing through the fan then drives it counterclockwise.

The invention claimed is:

1. A device for ventilating and electrically powering a computer of an engine of an aircraft, the device comprising:
   air feed means for feeding air to a proximity of the computer; and
   a fan driven by motor means and configured to generate an air stream for ventilating the computer;
   wherein the fan is mounted in the air feed means or at an outlet from the air feed means; and
   wherein the motor means comprises an electrical machine configured to operate as a motor to drive the fan when the aircraft is on the ground to generate the air stream for ventilating the computer, and as a generator to power the computer electrically while the aircraft is in flight, a rotor of the electrical machine operating as a generator being driven by the fan, which is itself driven by a stream of air taken from outside the engine when the aircraft is in flight, and flowing along or leaving the air feed means.

2. A device according to claim 1, wherein the electrical machine is a brushless permanent magnet motor, or includes a three-phase stator.

3. A device according to claim 1, wherein the electrical machine is connected to electrical power supply means of the aircraft to enable it to operate as a motor on the ground.

4. A device according to claim 1, wherein the electrical machine is controlled by the computer and has power of an order of 100 W to 300 W, or 150 W to 200 W.

5. A device according to claim 1, wherein the electrical machine includes two stators that are electrically connected to the computer via independent paths.

6. A device according to claim 1, wherein the fan includes radial blades of fixed or variable angular pitch.

7. A device according to claim 1, wherein the fan includes variable-pitch blades, the electrical machine including a rotor that is movable in translation inside the stator with one end connected to means for actuating and pivoting the blades about their axes, and with its other end connected to a fly-weight governor.

8. A device according to claim 1, wherein the fan includes variable-pitch blades, the electrical machine comprising a rotor having one end surrounded by a hub supporting blades and around which a ring is mounted to move in turning and is connected by links to means for pivoting the blades about their respective radial axes, the hub being movable in turning around the rotor, which includes at least one radial finger passing through a circumferential slot in the hub and an orifice of the ring, an angular movement of the ring around the hub being a function of an angular movement of the radial finger of the rotor in the slot of the hub.

9. A device according to claim 8, wherein the rotor includes two diametrically opposite radial fingers, each passing through a respective circumferential slot in the hub and a respective orifice in the ring.

10. A method of using a device according to claim 1, the method comprising, when the aircraft is in flight, air flowing in the feed means passes through and drives rotation of the fan, which in turn drives rotation of the rotor of the electrical machine to power the computer, which is cooled by the air leaving the feed means, and while the aircraft is on the ground, electrical power supply means of the aircraft power the computer and the electrical machine to drive the fan to generate a stream of ventilation air for the computer.

* * * * *